(12) United States Patent
Horn

(10) Patent No.: US 7,319,263 B2
(45) Date of Patent: Jan. 15, 2008

(54) SEMICONDUCTOR COMPONENT WITH SWITCHING ELEMENT CONFIGURED TO REDUCE PARASITIC CURRENT FLOW

(75) Inventor: Wolfgang Horn, Klagenfurt (AT)

(73) Assignee: Infineon Technologies AG, Munich (DE)

(*) Notice: Subject to any disclaimer, the term of this patent is extended or adjusted under 35 U.S.C. 154(b) by 71 days.

(21) Appl. No.: 10/975,554

(22) Filed: Oct. 28, 2004

(65) Prior Publication Data
US 2005/0110111 A1 May 26, 2005

(30) Foreign Application Priority Data
Oct. 28, 2003 (DE) ............... 103 50 162

(51) Int. Cl.
*H01L 29/00* (2006.01)
(52) U.S. Cl. .................. 257/517; 257/E27.01
(58) Field of Classification Search ........... 257/517, 257/E27.011, E27.012, E27.014, E27.015
See application file for complete search history.

(56) References Cited

U.S. PATENT DOCUMENTS

| | | | |
|---|---|---|---|
| 4,376,286 A | * | 3/1983 | Lidow et al. ............... 257/342 |
| 4,830,973 A | * | 5/1989 | Mastroianni ............... 438/203 |
| 5,021,860 A | | 6/1991 | Bertotti et al. |
| 5,545,917 A | * | 8/1996 | Peppiette et al. ........... 257/547 |
| 5,719,431 A | | 2/1998 | Werner |
| 5,889,310 A | | 3/1999 | Terashima et al. |
| 6,248,616 B1 | | 6/2001 | Ravanelli et al. |

FOREIGN PATENT DOCUMENTS

| | | |
|---|---|---|
| EP | 0813247 | 5/1996 |
| WO | WO 93/07642 | 4/1993 |

* cited by examiner

*Primary Examiner*—Thomas L. Dickey
(74) *Attorney, Agent, or Firm*—Dicke, Billig & Czaja PLLC

(57) ABSTRACT

A semiconductor component is described. In one embodiment, the semiconductor component includes a switching element integrated in the semiconductor component between two functional element semiconductor regions, configured to reduce a parasitic current flow through the semiconductor component.

16 Claims, 7 Drawing Sheets

SEMICONDUCTOR COMPONENT WITH SWITCHING ELEMENT CONFIGURED TO REDUCE PARASITIC CURRENT FLOW

CROSS-REFERENCE TO RELATED APPLICATIONS

This Utility Patent Application claims priority to German Patent Application No. DE 103 50 162.2, filed on Oct. 28, 2003, which is incorporated herein by reference.

FIELD OF THE INVENTION

The invention relates to a semiconductor component which has a plurality of semiconductor functional elements which are connected in parallel or in series with one another.

BACKGROUND

It is known practice, in the field of power semiconductor components, to connect a plurality of semiconductor functional elements, for example transistors or diodes, to one another in parallel or in series and to concentrate the semiconductor functional elements (which have been connected) in one semiconductor component. This makes it possible, inter alia, to divide the load—which has been applied to the semiconductor component—among a plurality of semiconductor functional elements, with the result that, even in the case of high electric currents and voltages which have to be "processed" in the field of power semiconductors, no damage occurs in the semiconductor component.

One example of a semiconductor component containing a plurality of parallel-connected transistors will be explained in more detail below with reference to FIG. 4.

One part of a semiconductor component 1 has a first semiconductor layer 2 and a second semiconductor layer 3. The second semiconductor layer 3 has been divided into a plurality of semiconductor regions by means of insulator structures, in this case a first insulation layer 4 and a second insulation layer 5 which respectively intersect the second semiconductor layer 3 at a right angle. In this case, the part of the semiconductor component 1 in FIG. 3 exhibits a first, a second and a third functional element semiconductor region 6, 7 and 8, it being possible to see the full width of only the second functional element semiconductor region 7 and only the right-hand and the left-hand end, respectively, of the first and the third functional element semiconductor region 6, 7, respectively. In this example, the first and second insulator structures 4, 5 are provided by a p-doped material, whereas the first to third functional element semiconductor regions 6 to 7 each comprise an n-doped semiconductor material. In this example, the first semiconductor layer 2 comprises a wealdy p-doped material. The second functional element semiconductor region 7 is part of a MOS field effect transistor which furthermore has an n-doped source region 9, a p-doped body region 10—which have been impressed into the second functional element semiconductor region 7—and a drain region 11 which, inter alia, runs at a boundary between the first and second semiconductor layers 2, 3. In this case, the drain region 11 comprises a heavily n-doped material. A gate 12 can be used to induce a n-channel in the body region 10, so that an electric current can flow from the source region 9, through the second functional element semiconductor region 7 (base), into the drain region 11. D, S and G are respectively used to denote a drain, a source and a gate connection.

The problem of electrons emerging from the drain region 11, diffusing through the first semiconductor layer 2, circumventing the second insulator structure 5 and passing into the adjacent third functional element semiconductor region 8 arises when a negative drain voltage is applied to the drain region 11. Similarly, electrons which emerge from the drain region 11 may diffuse through the first semiconductor layer 2, circumvent the first insulator structure 4 and enter the first functional element semiconductor region 6. If electrons pass in such a manner into adjacent semiconductor regions or semiconductor regions which are further away (the electrons may diffuse over several mm), they may impair the way in which the semiconductor functional elements—which have been implemented in said regions—work (in this example, both the first functional element semiconductor region 6 and the third functional element semiconductor region 8 are parts of respective MOS field effect transistors which have been omitted in FIG. 3 for the sake of simplicity). Similar problems may also arise when other semiconductor functional elements, for example diodes, are used instead of the MOS field effect transistors.

In this case, the circuit diagram of a parasitic bipolar transistor T schematically symbolizes the diffusion of the electrons from the second functional element semiconductor region 7 into the third functional element semiconductor region 8.

In order to reduce the above-described parasitic parallel-path currents, particularly between adjacent semiconductor regions, it is known practice to lower a potential difference between the base and emitter of one of the parasitic pnp/npn structures by appropriately connecting a plurality of parasitic npn or pnp structures. A first exemplary embodiment of such a connection is shown in FIG. 6 and will be explained below.

Since the part of a semiconductor component which is shown in FIG. 6 closely resembles the design shown in FIG. 4, only the fundamental differences will be discussed here.

The part of a semiconductor component 1' which is shown in FIG. 6 has a first functional element semiconductor region 6 and a second functional element semiconductor region 7, a bipolar transistor (n-p-n) being formed in the first functional element semiconductor region 6, and a MOS transistor being formed in the second functional element semiconductor region 7. Each of the functional element semiconductor regions 6, 7 is surrounded by a first and a second insulation structure 4, 5. A third insulation structure 13 having the same doping as that of the first and second insulation structures 4, 5 is provided between the second insulation structure 5 in the first functional element semiconductor region 6 and the first insulation structure 4 in the second functional element semiconductor region 7. A semiconductor structure 14 having the same doping as a collector region 19 within the first functional element semiconductor region 6 and a drain region 11 within the second functional element semiconductor region 7 is furthermore provided between the third insulation structure 13 and the first insulation structure 4 in the second functional element semiconductor region 7. The third insulation structure 13 and the semiconductor structure 14 run from a top side of the second semiconductor layer 3 to the underside of the latter, or project somewhat into the first semiconductor layer 2, and their top ends are electrically connected via a line 15. Together with the drain region 11 in the second functional element semiconductor region 7 and the intermediate part of the first semiconductor layer 2 and the first insulation structure 4 in the second functional element semiconductor region 7, that part of the semiconductor structure 14 which adjoins the first semiconductor layer 2 or that part of the semiconductor structure 14 which projects into the first semiconductor layer 2 forms a first parasitic npn structure $Q_{n1}$. Similarly, the collector region 19 within the first functional element semiconductor region 6 and the drain region 11 within the second functional element semiconductor region 7 and also the intermediate part of the first semiconductor layer 2 form, together with the third insulation structure 13, a second parasitic npn structure $Q_{n2}$. The parasitic structures $Q_{n1}$ and $Q_{n2}$ are symbolized in FIG. 6 by corresponding equivalent circuit diagrams.

The base of the second parasitic npn structure is connected to the collector of the first parasitic npn structure via the line 15. This makes it possible to reduce a base/emitter voltage of the second parasitic npn structure $Q_{n2}$. The disadvantage of the semiconductor component 1' shown in FIG. 6 is that the base/emitter voltage of the second parasitic npn structure $Q_{n2}$ can be reduced, at most, to a saturation voltage of the first parasitic npn structure $Q_{n1}$. It is not possible to reduce said base/emitter voltage any further, with the result that it is not possible to completely turn off the second parasitic npn structure $Q_{n2}$.

An alternative embodiment for reducing the base/emitter voltage of the second parasitic npn structure $Q_{n2}$ is shown in FIG. 8, which is explained below. A semiconductor structure 16 which is connected to the first insulation structure 4 in the second functional element semiconductor region 7 by means of a line 17 is provided, in one part of a semiconductor component 1", besides the second insulation structure 5 in the second functional element semiconductor region 7 and outside the latter. In this exemplary embodiment, the first parasitic npn structure $Q_{n1}$ is formed by the semiconductor structure 16, the drain region 11 within the second functional element semiconductor region 7 and also the intermediate part of the first semiconductor layer 2 and the second insulation structure 5 in the first functional element semiconductor region 7. The second parasitic npn structure $Q_{n2}$ is formed by the collector region 19 within the first functional element semiconductor region 6 and the drain region 11 within the second functional element semiconductor region 7 and also the intermediate part of the first semiconductor layer 2 and the first insulation structure 4 in the second functional element semiconductor region 7. In this case, the second insulation structure 5 in the second functional element semiconductor region 7 is grounded.

The base of the second parasitic npn structure $Q_{n2}$ is connected to the collector of the first parasitic npn structure $Q_{n1}$ via the line 17, with the result that it is possible to lower a base/emitter voltage of the second parasitic npn structure $Q_{n2}$ to the saturation voltage of the first parasitic npn structure $Q_{n1}$. As in the embodiment described in FIG. 6, it is not possible to lower the base/emitter voltage any further here either.

FIGS. 5 and 7 show corresponding plan views of parts of the semiconductor components 1', 1" shown in FIGS. 6 and 8. It can be seen in FIG. 5 that the top ends of the third insulation structure 13 and of the semiconductor structure 14 are electrically connected to one another by means of the line 15. In this case, the part labeled with reference 18 schematically symbolizes all of the structures which are located to the right of the semiconductor structure 14 and are important for the operation of the MOS transistor formed in the second functional element semiconductor region 7. Similarly, it can be seen in FIG. 7 that the top ends of the first insulation structure 4 in the second functional element semiconductor region 7 and of the semiconductor structure 16 are connected to one another via the line 17.

FIG. 9 shows an equivalent circuit diagram which forms the basis of the semiconductor components 1', 1" described in FIGS. 6 and 8. In the embodiment shown in FIG. 8, $R_{sub1}$ denotes the resistance through the second insulation structure 5, $R_{sub2}$ denotes the resistance through the first semiconductor layer 2 (from an underside of the first semiconductor layer 2 to an underside of the semiconductor structure 4), $R_{sub3}$ denotes the resistance through the semiconductor structure 16, and $R_{metal}$ denotes the resistance of the line 17, for example. Similarly, in the embodiment shown in FIG. 6, $R_{sub1}$ denotes the resistance through the first semiconductor layer 2 (from an underside of the first semiconductor layer 2 to an underside of the first insulation structure 4), $R_{sub2}$ denotes the resistance through the first semiconductor layer 2 (from an underside of the first semiconductor layer 2 to an underside of the semiconductor structure 13), $R_{sub3}$ denotes the resistance through the semiconductor structure 14, and $R_{metal}$ denotes the resistance of the line 15. $R_{c1}$ is used to denote the resistive coupling between the first insulation structure 4 and the semiconductor structure 13 (FIG. 6) and the resistive coupling between the first insulation structure 4 and the second insulation structure 5 (FIG. 8). Reference 20 is used to denote a DMOS structure formed in the second functional element semiconductor region 7, and reference 21 is used to denote a reverse diode inherent in the DMOS structure.

SUMMARY

Embodiments of the present invention provide a semiconductor component having a switch integrated in the semiconductor component that can be actively driven to reduce parasitic currents in adjacent regions.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of the present invention provide a semiconductor component which can be used to reduce the base/emitter voltage of a parasitic pnp or npn structure to a greater extent than has hitherto been possible in order to further reduce or prevent lateral parallel-path currents between the functional elements in the semiconductor component.

The inventive semiconductor component has a plurality of semiconductor functional elements (which are connected, in particular, in parallel or in series with one another) and a first and a second semiconductor layer, the second semiconductor layer being applied to the first semiconductor layer and having the opposite doping to the latter. Insulator structures are also provided, said insulator structures being formed at least in the second semiconductor layer and being used to divide the second semiconductor layer into a plurality of functional element semiconductor regions which are insulated from one another. Each semiconductor functional element is formed, at least in part, from one of these functional element semiconductor regions. A switching element is integrated in the semiconductor component and can be driven actively, reduces the switching element a parasitic flow of current through an npn/pnp structure—which is formed by a respective part of two functional element semiconductor regions and the intermediate part of the first semiconductor layer (and/or one of the insulator structures located between the functional element semiconductor regions—by generating a flow of current which reduces a base/emitter voltage of the parasitic npn/pnp structure.

A MOS structure or a transistor may be used, in particular, as the switching element.

Figure 5:
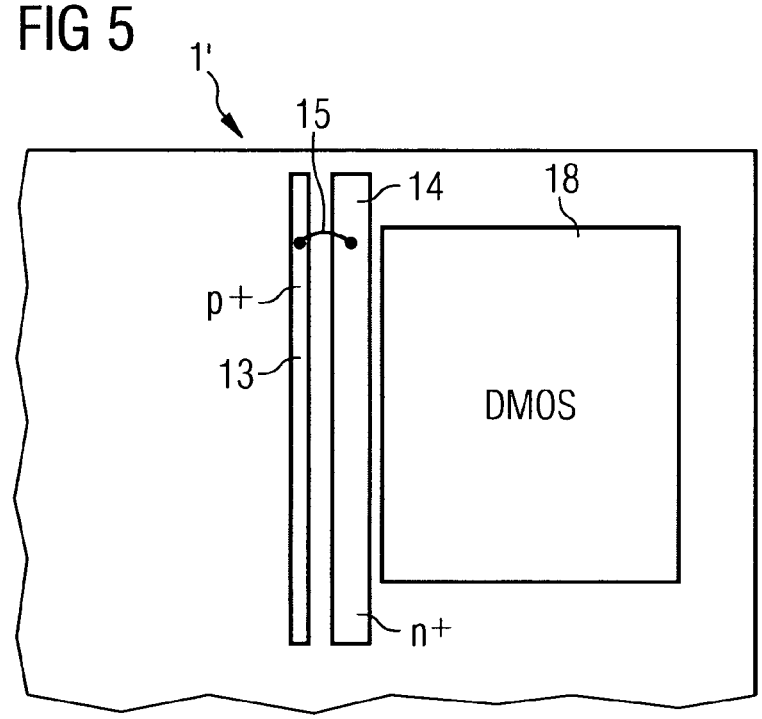
FIG. 5 illustrates a plan view of a part of the semiconductor component illustrated in FIG. 6.
Figure 7:
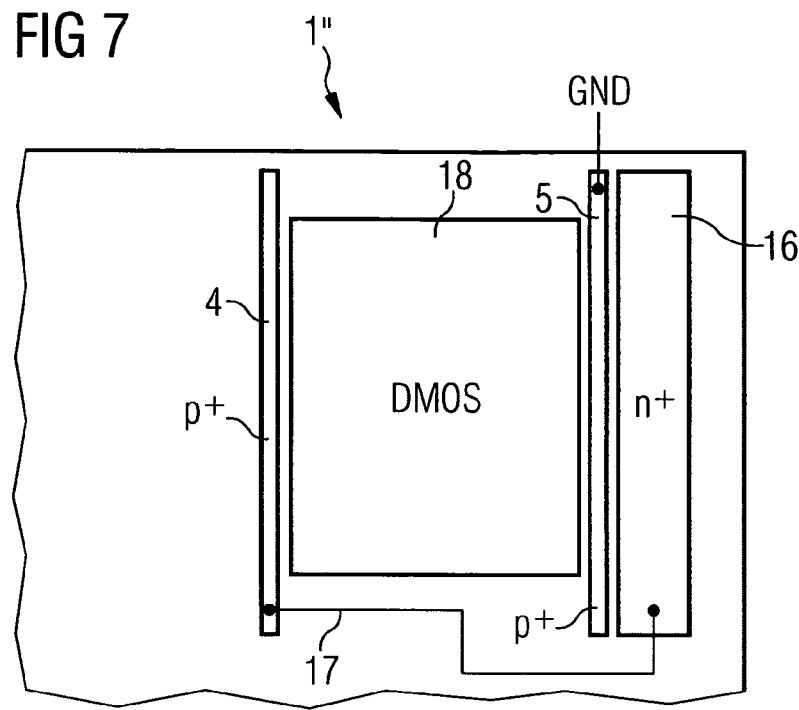
FIG. 7 illustrates a plan view of a part of the semiconductor component illustrated in FIG. 8.

In this case, the insulator structures do not necessarily have to "completely" insulate the functional element semiconductor regions, that is to say do not necessarily have to completely surround the latter. "Partial insulation", as shown in FIGS. 5 and 7, may be sufficient, depending on the application.

The insulator structures preferably adjoin the first semiconductor layer directly and comprise semiconductor material which has the opposite doping to the second semiconductor layer.

The switching element (also referred to below as the "lowering switching element") which is used to lower the base/emitter voltage is preferably formed in such a manner that it can be used to control a flow of current between one of the insulator structures and the functional element semiconductor region adjoining the insulator structure. To this end, a source zone which is connected to a source connection of the lowering switching element can be integrated, for example, into the insulator structure. A gate can then be used to control a flow of current from the source region, through the insulator structure, into the adjoining functional element semiconductor region. Such a flow of current can be used to reduce the base/emitter voltage of a parasitic npn/pnp structure to zero (short circuit at the base/emitter junction of the parasitic npn/pnp structure). Reducing the base/emitter voltage of a parasitic npn/pnp structure is thus no longer restricted to the saturation voltage of a further parasitic npn/pnp structure.

In this case, the switching element which is used to reduce the base/emitter voltage may be in the form of an independent functional element or else may "share the use of" a drain zone in the switching element formed in the adjoining functional element semiconductor region. In the latter case, only one additional source zone and one additional gate are thus added to the semiconductor component, and the insulator structure adjoining the functional element semiconductor region is changed.

The invention has the advantage that it is possible to dispense with the production of additional parasitic structures which are connected to already existing parasitic structures and are intended to reduce undesirable lateral parallel-path currents.

Figure 1:
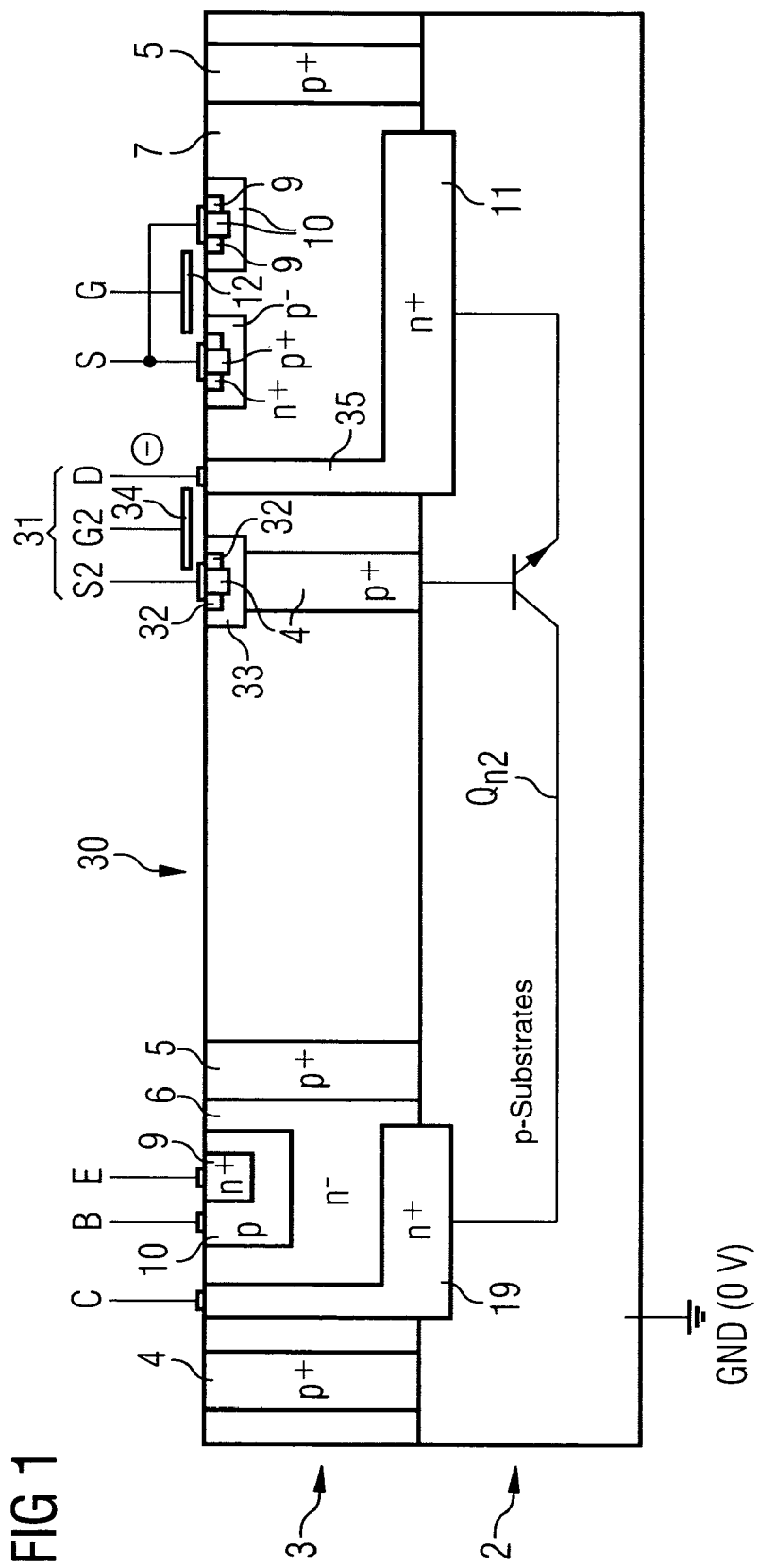
FIG. 1 illustrates one preferred embodiment of an inventive semiconductor component.
Figure 6:
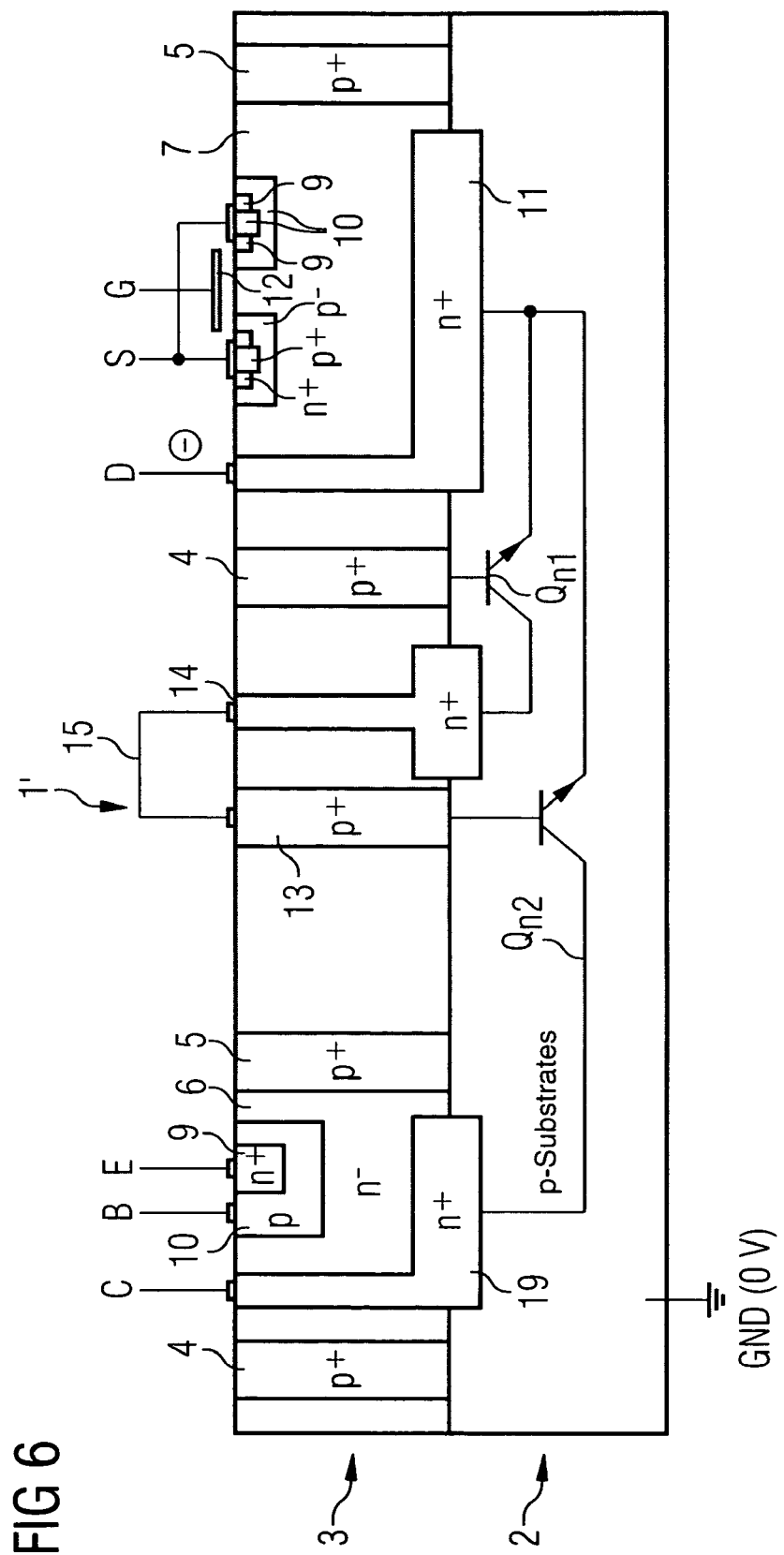
FIG. 6 illustrates a cross section illustration of a second embodiment of a conventional semiconductor component.
Figure 8:
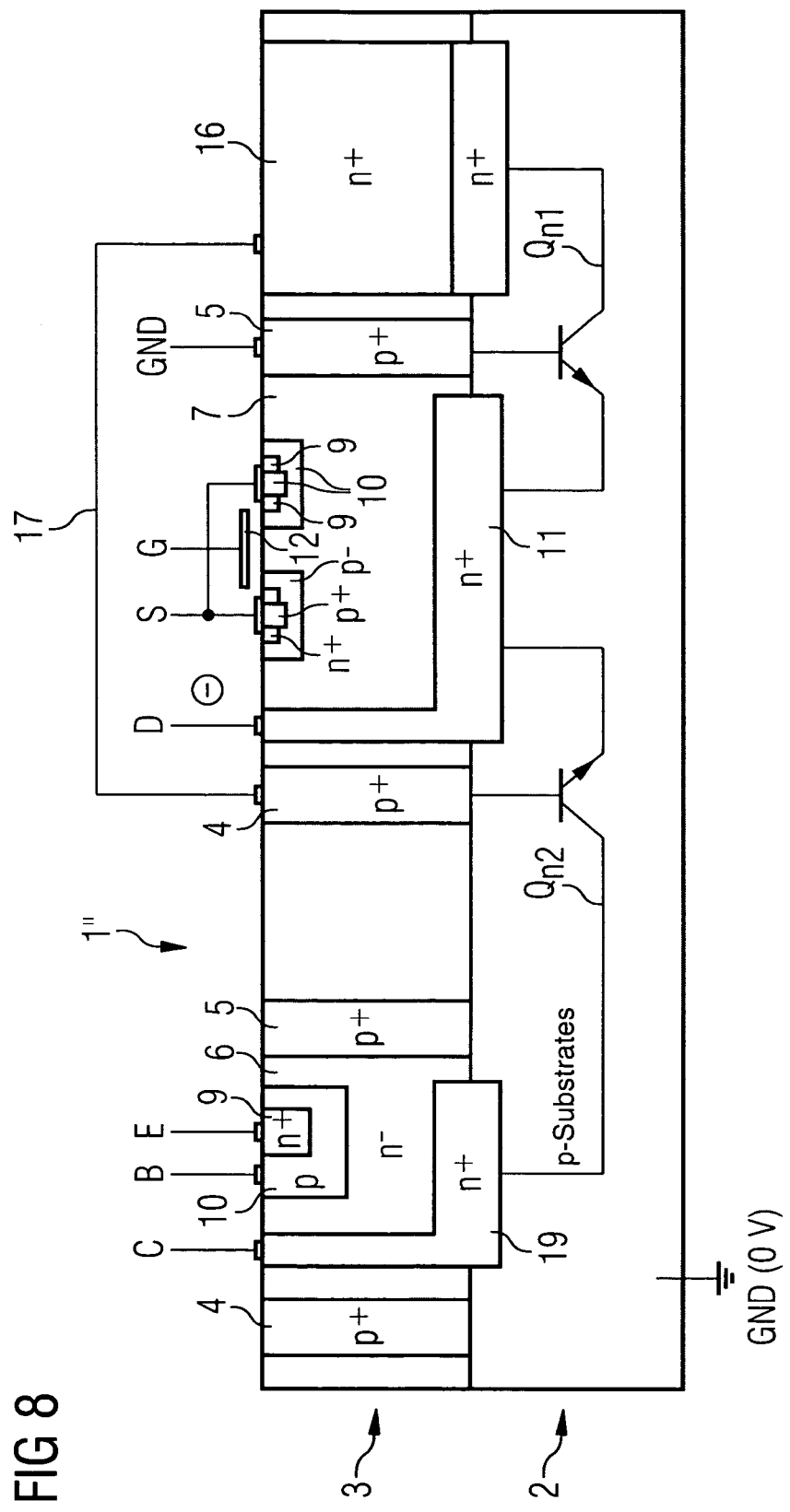
FIG. 8 illustrates a cross section illustration of a third embodiment of a conventional semiconductor component.

FIG. 1 illustrates a semiconductor component 30 whose design is similar to that of the semiconductor components 1', 1" illustrated in FIGS. 6 and 8. One fundamental difference from the conventional semiconductor components 1', 1" illustrated in FIGS. 6 and 8 is that a switching element in the form of an additional transistor 31 having source regions 32, a body region 33, a gate 34 and a drain region 35 is provided. The transistor 31 can be driven actively and is preferably activated when a negative voltage is applied to the drain region 11. Activating the transistor 31 produces a flow of current between the source regions 32 and the second functional element semiconductor region 7 or the drain region 11. To this end, the gate 34 induces a channel in the body region 33. The flow of current through the body region 33 reduces the potential between the base and the emitter of the parasitic npn structure $Q_{n2}$. The transistor 31 can even be used to completely short-circuit a base/emitter junction in the parasitic transistor $Q_{n2}$. In this case, the embodiment illustrated in FIG. 1 is highly schematic, and details of the edge structures in the transistor 31 and in the transistor formed in the second functional element semiconductor region 7 are not illustrated here.

The source regions 32 and the gate 34 of the transistor 31 (which is used to reduce the potential) are connected to a source connection S2 and a gate connection G2, respectively.

The "artificially" provided semiconductor structures—illustrated in FIGS. 6 and 8—for reducing parasitic parallel-path currents (references 13, 14 and 16) may be dispensed with in the embodiment illustrated in FIG. 1. However, this is not absolutely necessary; these semiconductor structures may also remain in the semiconductor component.

Figure 2:
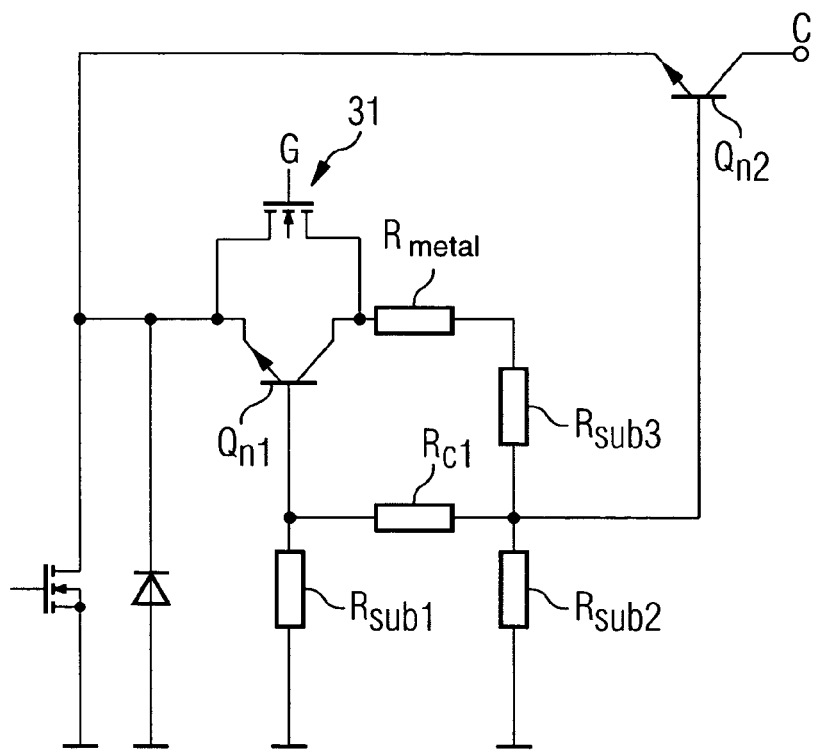
FIG. 2 illustrates an equivalent circuit diagram of the semiconductor component shown in FIG. 1.

The equivalent circuit diagram illustrated in FIG. 2 shows the situation in which additional semiconductor structures (these additional semiconductor structures are not illustrated or contained in FIG. 1) which form a first npn/pnp structure $Q_{n1}$ are provided in the semiconductor component. The transistor 31 used to reduce the potential is connected in parallel with the first parasitic npn/pnp structure $Q_{n1}$, if there is such a structure. If the parasitic transistor $Q_{n1}$ is dispensed with (as illustrated in FIG. 1), it is "replaced" by the transistor 31.

In the figures, "C", "B", "E" are used to denote a collector, a base and an emitter connection.

Figure 3:
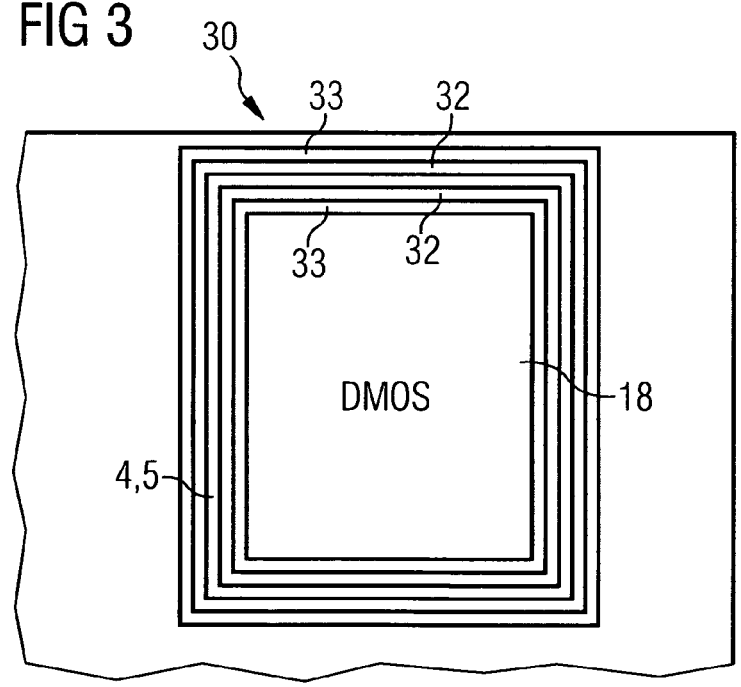
FIG. 3 illustrates a plan view of a part of the semiconductor component Shown in FIG. 1.
Figure 4:
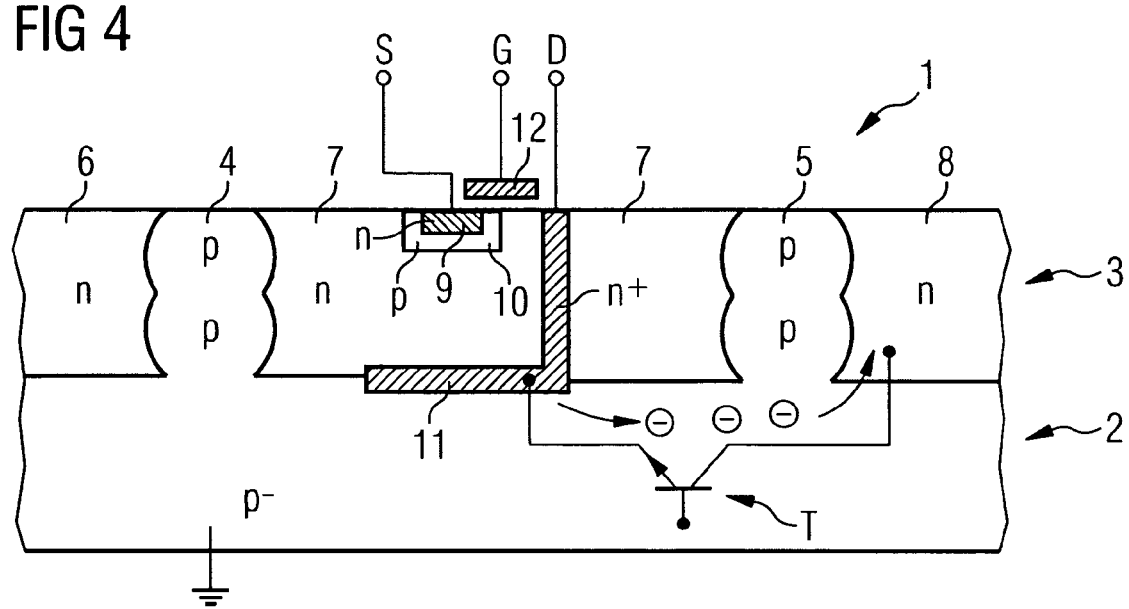
FIG. 4 illustrates a cross section illustration of a first embodiment of a conventional semiconductor component.

FIG. 3 illustrates a part of one possible embodiment of the transistor 31 used to lower the potential, in which embodiment said transistor is in the form of an annular structure which surrounds the functional element (transistor) formed in the second functional element semiconductor region. This makes it possible to lower the potential in a particularly effective manner. However, the invention is not restricted to this embodiment; it suffices if the transistor 31 is in the form of an elongate structure similar to the first and second insulation structures 4, 5 in FIG. 7.

The p- and n-regions illustrated in the embodiments may of course be doped in the opposite manner, that is to say p- and n-regions may be interchanged.

Figure 10:
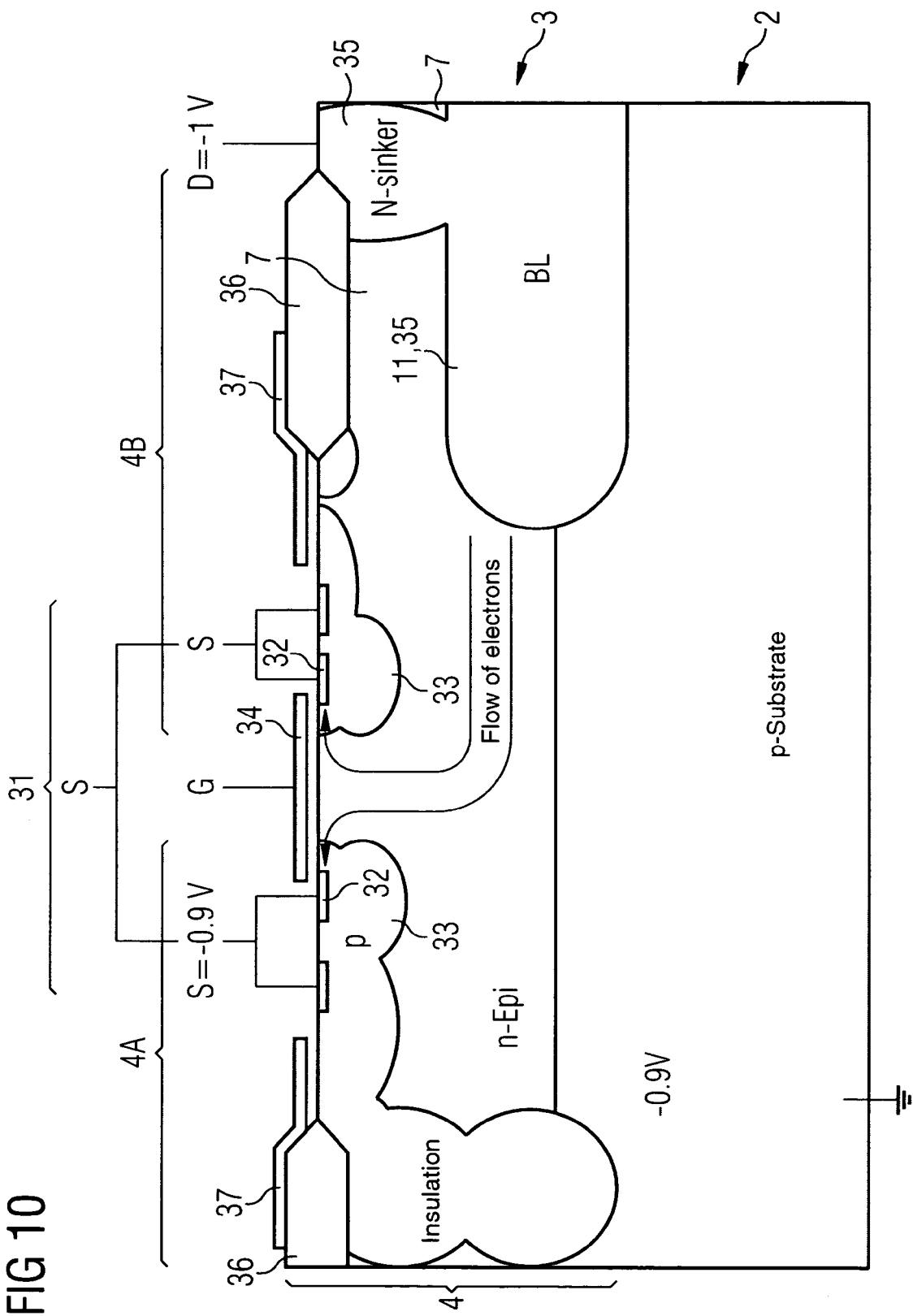
FIG. 10 illustrates a detail illustration of an interface between the insulator structure and the adjoining functional element semiconductor region.

FIG. 10 is a detail illustration of one embodiment of an interface between the insulator structure 4 and the adjoining functional element semiconductor region 7. In this embodiment, the insulator structure 4 has been divided into a first part 4A and a second part 4B which are isolated from one another by a part of the second functional element semiconductor region 7. In order to achieve better insulation, two field oxide layers 36 that are covered, at least partially, by a metal layer 37 are additionally provided. In this embodiment, a lightly doped n-epi region is connected in series, as a result of which an electrical field is reduced and a voltage breakdown is avoided at high voltages.

The invention may also be described as follows:

The invention relates to a novel solution to the problem of the injection of minority carriers into junction-isolated BCD (bipolar/CMOS/DMOS) technologies.

Figure 9:
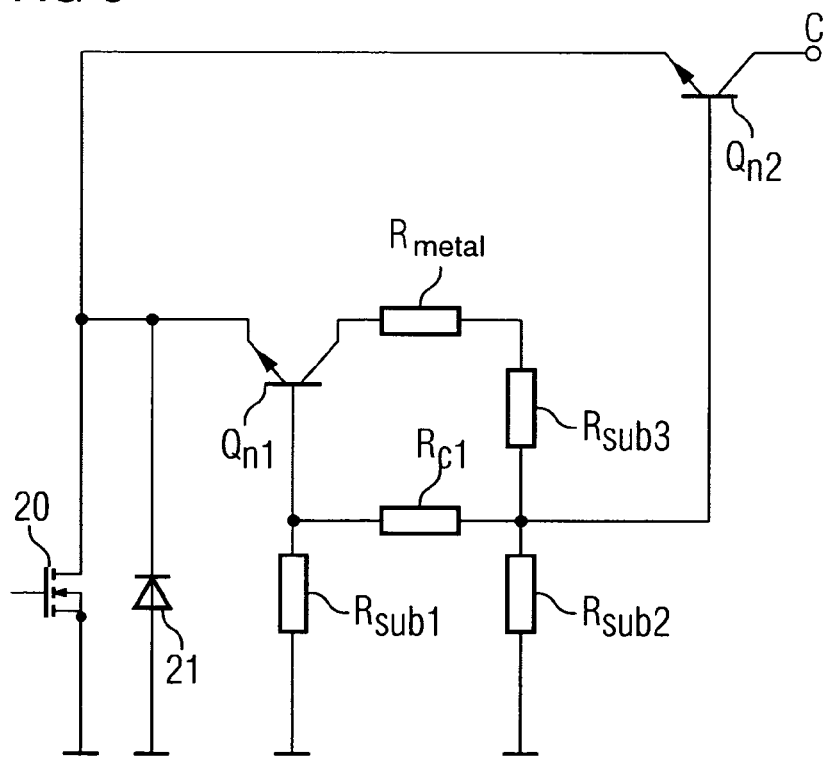
FIG. 9 illustrates an equivalent circuit diagram of the semiconductor components illustrated in FIGS. 6 and 8.

Guard structures have hitherto been known, said guard structures having in common the fact that the substrate potential is lowered locally—which is intended to lead to the suppression of the lateral npn parasitic in the substrate—with the aid of this very parasitic (FIGS. 6, 8). The electrical equivalent circuit diagram in FIG. 9 illustrates that, in the case of optimized parasitic impedances, the base/emitter voltage of the interfering parasitic $Q_{n2}$ can be reduced to the saturation voltage of the parasitic $Q_{n1}$. However, it is not possible to reduce said base/emitter voltage any further, as a result of which it is not possible to completely turn off $Q_{n2}$.

According to the invention, the substrate potential is lowered, and the parasitic npn transistor $Q_{n2}$ in the substrate is thus suppressed locally, by means of an active MOS structure. The latter is connected in parallel with the parasitic $Q_{n1}$ (which is usually used for this purpose) and makes it possible to reduce the potential to a greater extent, since said reduction is no longer limited by the saturation voltage of the bipolar parasitic $Q_{n1}$. In theory, it is thus possible to completely short-circuit the base/emitter junction in $Q_{n2}$.

FIG. 2 illustrates a basic circuit diagram of the arrangement. If the additional FET is driven in a suitable manner (turned on when negative potentials occur on the drain of the DMOS), it short-circuits the base/emitter junction in the parasitic transistor $Q_{n2}$ and thus prevents the latter from being activated. One fundamental aspect of the invention is to use an active MOS structure to lower the substrate potential to a greater extent than has hitherto been possible. As a result, the limit for lowering the substrate potential (which limit has hitherto been the saturation voltage of the bipolar parasitic) is undershot and it is possible to completely deactivate the lateral npn parasitic.

FIG. 1 represents one exemplary embodiment. A source/bulk cell which is arranged outside the actual DMOS transistor (functional element) produces a flow of current from the drain of the DMOS to the substrate when the additional gate G2 is turned on. As a result, the substrate potential is lowered at the edge of the DMOS transistor, and the drain/substrate diode is reverse-biased. As illustrated in FIG. 3, this arrangement may be implemented, for example, in the form of a ring around the DMOS transistor. This makes it possible to integrate the protective structure into the edge termination of the DMOS transistor. If the active protection is not needed, G2 can be connected to S2, and the additional FET is not active. (The additional gate G2 is not illustrated in FIG. 3 for the sake of simplification).

Another embodiment would be to use a separate component (e.g. DMOS) to set up the connection between the drain and the substrate. Under some circumstances, this would be less efficient in terms of area, since the requisite Rdson (the drain/source resistance when turned on (turn-on resistance)) has to be low for good suppression efficiency. However, the advantage would be that this embodiment can be implemented using standard library components without any modification.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
   a first semiconductor layer;
   a second semiconductor layer positioned adjacent the first semiconductor layer, having a doping opposite the first semiconductor layer;
   insulator structures provided in the second semiconductor layer and dividing the second semiconductor layer into a plurality of functional element semiconductor regions insulated from one another, where a semiconductor functional element is formed, at least in part, from one of the functional element semiconductor regions; and
   a switching element integrated as a field effect transistor in the semiconductor component between two functional element semiconductor regions and electrically connected between base and emitter terminals of a NPN/PNP structure which is formed by a respective part of the two functional element semiconductor regions and an intermediate part of the first semiconductor layer;
   said field effect transistor comprising:
   a source region provided within one of said insulator structures between said two functional element semiconductor regions;
   a gate region;
   a body region; and
   a drain region;
   the field effect transistor being driven actively when a negative voltage is applied to the drain region thereof, wherein the gate region induces a channel in the body region, which controls a current flowing from the source region through said one insulator structure to the adjoining functional element semiconductor to reduce a base/emitter voltage and whereby the parasitic flow of a current through that NPN/PNP structure.

2. The semiconductor component of claim 1, wherein the insulator structures adjoin the first semiconductor layer and comprise semiconductor material which has the opposite doping to the second semiconductor layer.

3. The semiconductor component of claim 2, wherein the switching element can be used to control a flow of current between an insulator structure and the adjoining functional element semiconductor region.

4. The semiconductor component of claim 3, wherein the switching element is a transistor.

5. The semiconductor component of claim 4, further comprising:
   a source zone which is connected to a source connection of the transistor is integrated in the insulator structure, and a gate which can be used to control a flow of current from the source region, through the insulator structure, into an adjoining functional element semiconductor region.

6. The semiconductor component of claim 5, wherein the functional element which is formed in the adjoining functional element semiconductor region is a transistor, a drain zone of the transistor which is formed in the functional element semiconductor region simultaneously being the drain zone of the transistor which is used to reduce the parasitic current.

7. A semiconductor component having a plurality of semiconductor functional elements, comprising:
   a first semiconductor layer and a second semiconductor layer, the second semiconductor layer being applied to the first semiconductor layer and having the opposite doping to the latter;
   insulator structures that are provided at least in the second semiconductor layer and are used to divide the second semiconductor layer into a plurality of functional element semiconductor regions that are insulated from one another, each semiconductor functional element being formed, at least in part, from one of the functional element semiconductor regions;
   a switching element integrated as a field effect transistor in the semiconductor component between two functional element semiconductor regions;
   wherein it is possible to reduce a parasitic flow of current through an npn/pnp structure which is formed by a respective part of two functional element semiconductor regions and an intermediate part of the first semiconductor layer by using the switching element, which is integrated in the semiconductor component and can be driven actively, to generate a flow of current which reduces a base/emitter voltage of the npn/pnp structure, the parasitic current flow being generated by a parasitic transistor, wherein the switching element is connected electrically between base and emitter terminals of the parasitic transistor; and
   the field effect transistor having a gate region, a body region, a source region and a drain region, and being driven actively when a negative voltage is applied to the drain region,
   wherein the gate region induces a channel in the body region, which controls a current flowing from the source region through said one insulator structure to the adjoining functional element semiconductor to reduce a base/emitter voltage.

8. The semiconductor component of claim 7, wherein the insulator structures adjoin the first semiconductor layer.

9. The semiconductor component of claim 8, wherein the insulator structures comprise semiconductor material that has the opposite doping to the second semiconductor layer.

10. The semiconductor component of claim 8, wherein the switching element can be used to control a flow of current between an insulator structure and the adjoining functional element semiconductor region.

11. The semiconductor component of claim 9, wherein a source zone that is connected to a source connection of the transistor is integrated in the insulator structure, and a gate that can be used to control a flow of current from the source region, through the insulator structure, into the adjoining functional element semiconductor region is provided.

12. The semiconductor component as claimed in claim 11, wherein the functional element that is formed in the adjoining functional element semiconductor region is a transistor, a drain zone of the transistor that is formed in the functional element semiconductor region simultaneously being the drain zone of the transistor which is used to reduce the parasitic current.

13. A semiconductor component having a plurality of semiconductor functional elements, comprising:
   a first and a second semiconductor layer, the second semiconductor layer being applied to the first semiconductor layer and being doped inversely to the latter;
   insulator structures that are provided at least in the second
   semiconductor layer and are used to divide the second semiconductor layer into a plurality of functional element semiconductor regions that are insulated from one another, each semiconductor functional element being formed, at least in part, from one of the functional element semiconductor regions, it being possible to reduce a parasitic flow of current through an npn/pnp structure that is formed by a respective part of two functional element semiconductor regions and the intermediate part of the first semiconductor layer by using a switching element, that can be driven actively, to generate a flow of current that reduces a base/emitter voltage of the npn/pnp structure, wherein the switching element that can be driven actively is integrated, in the form of a transistor having a source region, a gate region, a body region and a drain region, in the semiconductor component in such a manner that the source region which is connected to a source connection of the transistor is provided in an insulator structure, and the gate which can be used to control a flow of current from the source region, through the insulator structure, into the adjoining functional element semiconductor region is provided, wherein the switching element is connected electrically between base and emitter terminals of the transistor; and
   wherein the transistor is driven actively when a negative voltage is applied to the drain region, and wherein the gate region induces a channel in the body region.

14. A semiconductor component comprising:
   a first semiconductor layer;
   a second semiconductor layer positioned adjacent the first semiconductor layer, having a doping opposite the first semiconductor layer;
   insulator structures provided in the second semiconductor layer, used to divide the second semiconductor layer into a plurality of functional element semiconductor regions insulated from one another, where a semiconductor functional element is formed, at least in part, from one of the functional element semiconductor regions; and switching means integrated in the semiconductor component between two functional element semiconductor regions, configured to reduce a parasitic current flow through the semiconductor component;

wherein said switching means includes a transistor having a gate region, a source region within one of said insulator structure between said two functional element semiconductor regions, a body region and a drain region, the transistor being driven actively when a negative voltages is applied to the drain region thereof, wherein the gate region induces a channel in the body region, which controls a current flowing from the source region through said one insulator structure to the adjoining functional element semiconductor to reduce a base/emitter voltage.

15. The semiconductor component of claim 14, wherein the switch means is configured to reduce a parasitic flow of current through an npn/pnp structure which is formed by a respective part of the two functional element semiconductor regions and an intermediate part of the first semiconductor layer.

16. A semiconductor component comprising:

a first semiconductor functional element and a second semiconductor functional element;

a transistor switch integrated in the semiconductor component between the first semiconductor element and the second semiconductor functional element, configured to be actively driven to reduce parasitic currents in the first semiconductor functional element and the second semiconductor functional element, the parasitic current flow being generated by a parasitic transistor, wherein the switching element is connected electrically between base and emitter terminals of the parasitic transistor; and the transistor switch having a gate region, a source region and a drain region, the switching element is driven actively when a negative voltage is applied to the drain region, the transistor includes a body region, and a gate induces a channel in the body region.

* * * * *